United States Patent [19]
Kiely et al.

[11] Patent Number: 5,953,355
[45] Date of Patent: Sep. 14, 1999

[54] SEMICONDUCTOR LASER PACKAGE WITH POWER MONITORING SYSTEM

[75] Inventors: Philip Kiely, Gilbert; Michael S. Lebby, Apache Junction, both of Ariz.

[73] Assignee: Motorola, Inc., Schaumburg, Ill.

[21] Appl. No.: 08/829,883

[22] Filed: Apr. 2, 1997

[51] Int. Cl.[6] ................................ H01S 3/18; H01S 3/19
[52] U.S. Cl. .............................. 372/43; 372/50; 250/211; 369/116; 437/209
[58] Field of Search ..................... 372/50, 43; 250/211; 437/209; 369/116

[56] References Cited

U.S. PATENT DOCUMENTS

| | | | |
|---|---|---|---|
| 5,136,152 | 8/1992 | Lee | 250/211 |
| 5,285,466 | 2/1994 | Tabatabaie | 372/50 |
| 5,352,632 | 10/1994 | Sawaya | 437/209 |
| 5,600,621 | 2/1997 | Noda et al. | 369/116 |

FOREIGN PATENT DOCUMENTS

| 4-48672 | 2/1992 | Japan | 372/43 |
|---|---|---|---|

*Primary Examiner*—Rodney Bovernick
*Assistant Examiner*—Sung T. Kim
*Attorney, Agent, or Firm*—Eugene A. Parsons; William E. Koch

[57] ABSTRACT

A semiconductor laser package including a plastic resin housing for encapsulating a vertical cavity surface emitting laser. The semiconductor laser package including a mounting base, a surround can and a cap. The cap having integrally formed therein a power monitoring system, such as a photodetector. The vertical cavity surface emitting laser generating an emission along a path. The photodetector optically positioned to receive a portion of the emission. The power monitoring system including a plurality of layers of an amorphous silicon material and/or a germanium material.

19 Claims, 1 Drawing Sheet

SEMICONDUCTOR LASER PACKAGE WITH POWER MONITORING SYSTEM

FIELD OF THE INVENTION

The present invention pertains to semiconductor lasers and more specifically to the packaging of semiconductor lasers.

BACKGROUND OF THE INVENTION

Since the development of laser diodes, many applications for their use have been developed. Increasingly, laser diodes are employed for communications and are integral to optical disc recording and storage systems. Typically, edge emitting diode lasers are used. Edge emitting diode lasers, however, have a high cost in parallel and serial data links, and have a high current drain due to a high threshold current when used in compact disc pickups.

New systems are being developed to employ vertical cavity surface emitting lasers (VCSELs) in place of edge emitting lasers. The VCSELs provide a much lower cost, use surface emissions which simplify optical devices and are capable of being fabricated in larger volumes on semiconductor wafers. However, a problem exist in the packaging of such VCSELs, namely the cost of materials employed in the typical "can" type packages. The conventional semiconductor laser apparatus utilizes a metal transistor outline (TO) can for packaging, and includes the formation of a "window" within a cap portion of the can through which the laser emission passes. In that metal is utilized in which a "window" must be formed, the cost of materials impacts the yield. Therefore, there exist a need for packaging of vertical cavity surface emitting lasers that would reduce the cost of manufacture.

In addition, there is a need to incorporate into the package a monitoring system which will automatically control the emissions emitted by the VCSEL. Generally, edge emitting laser diodes employ a power monitoring detector facing the back emission facet of the device. In a VCSEL with a wavelength shorter than 870 nm, there is no back emission due to the opaque substrate on which the device is necessarily formed.

Thus there is a need for a low cost semiconductor laser package that has included therein a power monitoring system, thus allowing automatic power control (APC) of the VCSEL emission.

Accordingly, it is highly desirable and an object of this invention to provide for a low cost semiconductor laser package that allows for monitoring of the VCSEL emission.

It is another purpose of the present invention to provide for a new and improved semiconductor laser package that is inexpensive, easily fabricated and allows for automatic power control of the VCSEL emission.

It is a still further purpose of the present invention to provide for a new and improved semiconductor laser package having a transparent uppermost portion, thereby permitting the passage of laser emissions therethrough.

SUMMARY OF THE INVENTION

The above problems and others are substantially solved and the above purposes and others are realized in a semiconductor laser package including a vertical cavity surface emitting laser generating an emission along a path, a power monitoring system positioned in the path of the emission and integrally formed with a portion of a plastic resin housing. The plastic resin housing encapsulating the vertical cavity surface emitting laser. The monitoring system, such as a photodetector, is formed integral with a cap portion of the plastic resin housing and designed to absorb a minimal portion of the incident light from the VCSEL emission passing therethrough.

BRIEF DESCRIPTION OF THE DRAWINGS

The novel features believed characteristic of the invention are set forth in the claims. The invention itself, however, as well as other features and advantages thereof will be best understood by reference to detailed descriptions which follow, when read in conjunction with the accompanying drawings, wherein:

DETAILED DESCRIPTION OF THE PREFERRED EMBODIMENT

Figure 1:
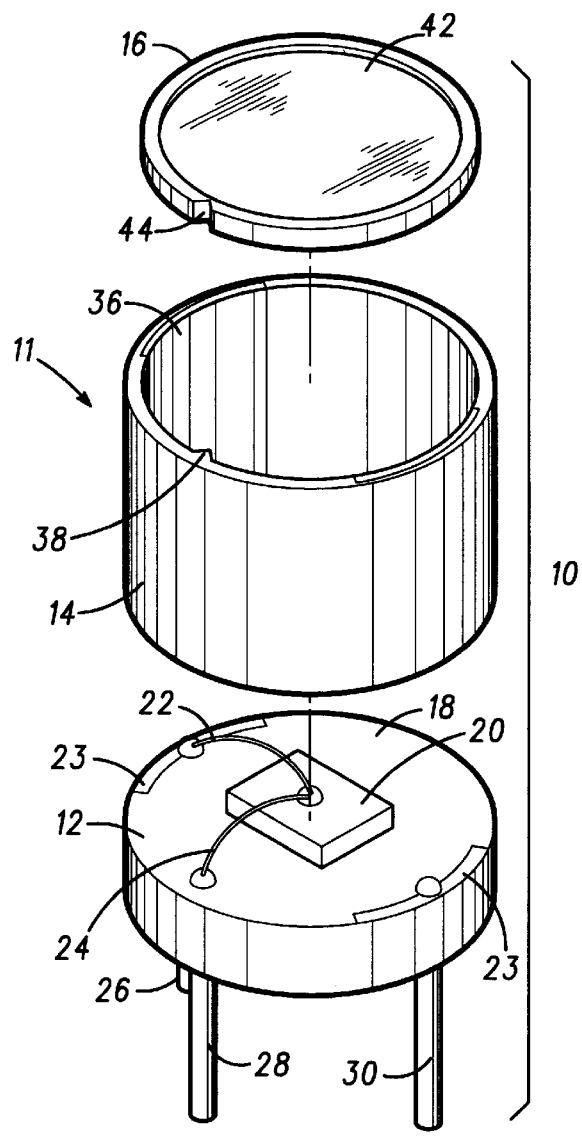
FIG. 1 is an exploded isometric view of a semiconductor laser package with power monitoring system in accordance with the present invention.

Turning now to the drawings in which like reference characters indicate corresponding elements throughout the several views, attention is first directed to FIG. 1 in which illustrated in exploded isometric view is a semiconductor laser package 10. Semiconductor laser package 10 includes a plastic resin housing 11, composed of a mounting base 12, a surround can 14 enclosing the upper surface of mounting base 12, and a cap 16. Plastic resin housing 11 is fabricated having a coefficient of thermal expansion (CTE) in a range of 10–30 ppm with a preferred CTE of 20 ppm or less. Mounting base 12 has positioned thereon an uppermost surface 18, a vertical cavity surface emitting laser (VCSEL) 20. In this particular embodiment, VCSEL 20 is a ridge VCSEL and fabricated utilizing epitaxial growth of a plurality of layers according to well known methods in the art. It should be understood throughout the description that the specific VCSEL illustrated, more specifically the illustrated ridge VCSEL, is being utilized for purposes of this disclosure only and can be any of a wide variety of different types of VCSELs including ridge, planar, those etched through the structure, etc.

Briefly, ridge VCSEL 20 of FIG. 1 is fabricated on any suitable semiconductor substrate, such as gallium arsenide, indium phosphide, or the like where the semiconductor substrate provides a surface. A first stack of distributed Bragg reflectors, an active region, and a second stack of distributed Bragg reflectors are epitaxially deposited on the surface by any suitable method, such as molecular beam epitaxy (MBE), metal-organic chemical vapor deposition (MOCVD), or the like. The first stack of distributed Bragg reflectors includes a plurality of layers of semiconductor material with alternating indexes of refraction. The active region is grown on the upper surface of the first stack of distributed Bragg reflectors, which includes one or more quantum wells separated by barrier layers with a spacer and/or cladding layer on either side thereof. The quantum wells and spacer layers are also grown epitaxially. The second stack of distributed Bragg reflectors is formed on the upper surface of the active region by, for example, epitaxially growing pairs of semiconductor layers as described in conjunction with the first stack. The first and second stacks are doped with opposite conductivity types to form a two terminal (diode) structure for the flow of electrical current therethrough. An electrical contact is positioned over the lower surface of the substrate. With the epitaxial depositions being complete, the second stack of distributed Bragg reflectors is patterned to form a ridge. Generally, ridge VCSEL 20 is made by any suitable well known method in the art, such as photolithography, etching, lift-off, any combination thereof, or the like. By defining a ridge in the second stack of distributed Bragg reflectors, an optical path is defined in the second stack of distributed Bragg reflectors that reflects and guides light formed in the active region. A complete disclosure of the construction of ridge VCSELs is available in U.S. Pat. No. 5,256,596 entitled "TOP EMITTING VCSEL WITH IMPLANT", issued Oct. 26, 1993, assigned to the same assignee and incorporated herein by this reference.

Referring more specifically to FIG. 1, once the epitaxial depositions are complete, and ridge VCSEL 20 has been formed, VCSEL 20 is mounted on an uppermost surface 18 of mounting base 12. In a preferred embodiment mounting base 12 is formed of an opaque plastic, thereby preventing external background light from entering semiconductor package 10. There is formed a metal lead 28, centrally positioned so as to optionally permit an end portion of metal lead 28 to serve as a support member for ease of mounting VCSEL 20. Metal lead 28 will also provide the ground contact for VCSEL 20 and power monitoring system 42. In addition, there is provided a lead 26 or contact pin for electrical interface with VCSEL 20, and a third lead 30 or contact pin for electrical interface with power monitoring system 42. Mounting base 12 has formed therein a plurality of embedded electrical conductors 23. In this particular embodiment electrical conductors 23 are embedded in and extend through mounting base 12. A plurality of wire bond interconnects 22 and 24, or similar interconnection, serve to electrically interface VCSEL 20 and power monitoring system 42 with metal leads 26, 28 and 30.

Surround can 14 is generally shaped as a typical TO canlike structure and formed of a molded plastic material. It should be understood that while the preferred embodiment of package 10 is described as a TO type laser package, other types of laser packages are anticipated by this disclosure, such as a surface mount transistor (SMT) type laser package or the like. In the preferred embodiment, surround can 14 has embedded therein electrical conductors 36 which align with electrical conductors 23 of mounting base 12. There is optionally formed on an interior surface of surround can 14 a positioning element 38, such as a registration mark, etc. Positioning element 38 will serve to aid in the alignment of cap 16 relative to surround can 14 of package 10.

During assembly, surround can 14 is positioned in alignment with mounting base 12, thereby enclosing VCSEL 20. Cap portion 16 is positioned in alignment with surround can 14 utilizing an optional cooperating positioning element 44. During alignment of semiconductor package 10, positioning element 44 aligns with positioning element 38. Cap portion 16 is fabricated to include a power monitoring system 42 integrally formed therewith. Power monitoring system 42 allows for the passage therethrough of substantially 100% of the light emitted by VCSEL 20, while absorbing a small percentage of the light for monitoring.

It should be understood that in the disclosed preferred embodiment of the semiconductor package of the present invention, that housing 11, more specifically mounting base 12, surround can 14 and cap 16 are formed of a substantially opaque molded plastic resin, with a transparent portion formed on the uppermost plane of cap 16, thereby permitting the laser emission to pass therethrough and preventing external background light from entering package 10 and thus interfering with monitoring system 42. It is further disclosed that alternatively, mounting base 12, surround can 14 and cap 16 can be formed of a substantially transparent molded plastic. It should be understood that the mounting base 12, surround can 14 and cap 16 as disclosed, can be molded as one integral piece, whereby VCSEL 20 is mounted on at least one of the plurality of metal leads 26, 28 and 30 prior to molding the package 10, more specifically housing 11 around the elements or as a multi-piece unit as illustrated. It should additionally be understood that the outside dimensions of the disclosed embodiments of semiconductor laser package 10 are the same as the typical TO metal type package, currently known in the art, for compatibility.

Figure 2:
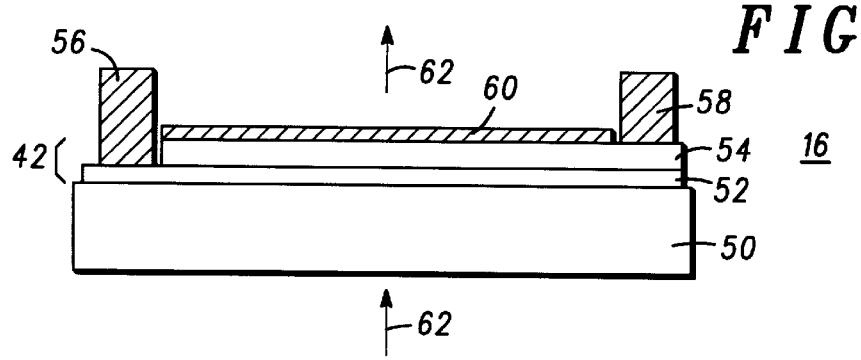
FIG. 2 is a simplified cross-sectional view of an integrally formed photodetector in accordance with the present invention.

Referring now to FIG. 2, illustrated is cap 16, composed of an optically transparent element 50, power monitoring system 42, and a layer of anti-reflective material 60. Power monitoring system 42 in this particular embodiment is composed of a p-doped layer of amorphous silicon 52, a n-doped layer of amorphous silicon 54, a p-ohmic contact 56, and a n-ohmic contact 58. During operation, light 62 generated by VCSEL 20 (not shown) passes through cap 16. Approximately 10% of the incident light is absorbed by power monitoring system 42. By integrally forming power monitoring system 42 as part of semiconductor laser package 10, more particularly cap 16, manufacturing cost are decreased and automated production is feasible. As stated, power monitoring system 42 is fabricated of a plurality of doped layers of an amorphous silicon material or any other suitable material such as a germanium material, or the like and operates similar to a solar cell. Generally, the depositions are performed by any suitable well-known method in the art such as chemical vapor deposition (CVD), plasma enhanced chemical vapor deposition (PECVD), sputtering, or the like.

Referring again to FIG. 1, electrical leads 26, 28 and 30 correspond to a contact pin for electrical interface with VCSEL 20, a ground contact, and a contact pin for electrical interface with power monitoring system 42, respectively. During operation, a voltage bias is applied to leads 26, 28 and 30 to establish an electrical field in VCSEL 20 and power monitoring system 42. When light 62 having a specific wavelength is emitted from VCSEL 20, it transmits through surround can 14 and through cap 16. More particularly, light 62 passes through layers 52 and 54 of the amorphous silicon material with a portion of light 62 being absorbed by the amorphous silicon material. The thickness of the silicon absorption region is so designed that about 10% of incident light 62 is absorbed and 90% of incident light 62 is transmitted therethrough. The photons absorbed in the amorphous silicon region create electron-hole pairs, and the pairs are separated by the electrical field with electrons drifting toward positive biased fingers and holes drifting toward negative biased fingers. If there is a closed loop between the fingers, electrical current is detectable with the magnitude being proportional to the incident laser intensity. The magnitude of the current can be used to send a feedback signal to VCSEL 20 to control injection circuitry for auto power control (APC).

During operation, VCSEL 20 generates a laser emission of which automatic power control (APC) is sought. Accordingly, in conjunction with power monitoring system 42, semiconductor laser package 10 is capable of monitoring the laser power output. It will of course be understood that contacts 56 and 58 of cap 16 could be formed on the reverse or lower surface of optically transparent element 50 if that is more convenient. Further, the photodetector, or photo sensitive device, being utilized has a specific sensitivity which generally must be supplied to produce an output signal.

Due to the low power operation of vertical cavity surface emitting lasers in general, thermal dissipation of semiconductor package 10 should not be a problem. Accordingly, there is optionally provided transparent epoxy or an underfill type material, with a coefficient of thermal expansion (CTE) equivalent to the VCSEL 20, thereby providing a buffer prior to the molding of plastic package 10, more specifically the housing 11, about the device or enclosure of the device within the molded plastic housing.

Figure 3:
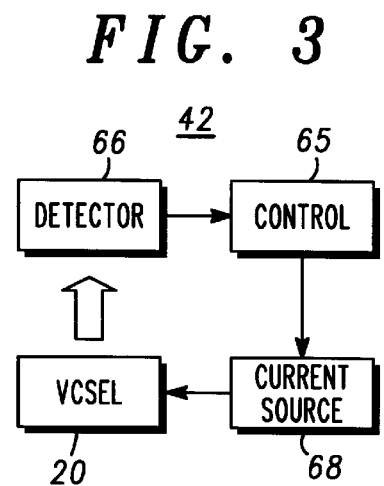
FIG. 3 is a block diagram of the power monitoring system including an automatic power control device in accordance with the present invention.

Turning now to FIG. 3, illustrated is the operation of the monitoring system of the present invention, referenced as 42. In monitoring system 42 the laser power of a VCSEL 20 is controlled by employing a feedback system. A control device 65 receives and processes the information monitored by a photodetector 66. More specifically, the laser power output based upon the specific laser power detected by monitoring the laser emission of VCSEL 20. This processing of the information monitored by photodetector 66 allows for the identification of a point at which a change in laser power is detected, thereby providing for automatic regulation of the current employed to drive VCSEL 20 from a current source 68. Thus, knowledge of the laser power at which the laser light is emitted, allows for automatic power control (APC) based on feedback, thereby maintaining operation of the laser at a specific, constant laser power output.

Thus, a semiconductor laser package with power monitoring system is disclosed. More specifically, a molded plastic resin housing, composed of a mounting base, a surround can and a cap, having formed therein metal leads and a power monitoring system. More specifically, there is provided housed within the package a vertical cavity surface emitting laser. A cap having formed integral therewith a photodetector is positioned within the emission path of the vertical cavity surface emitting laser, thereby serving to permit substantially 90% of the laser emission to pass therethrough and absorbing a small percentage for monitoring by the photodetector. The housing is formed of molded plastic thereby increasing yield by reducing the cost of the finished product.

While we have shown and described specific embodiments of the present invention, further modifications and improvement will occur to those skilled in the art. We desire it to be understood, therefore, that this invention is not limited to the particular forms shown and we intend in the appended claims to cover all modifications that do not depart from the spirit and scope of this invention.

What is claimed is:

1. A semiconductor laser package comprising:
    a vertical cavity surface emitting laser generating an emission along a path; and
    a plastic resin housing including a mounting base, a surround can, and a cap including a surface, for encapsulating the vertical cavity surface emitting laser, the cap including an integrally formed power monitoring system positioned to cover the complete surface of the cap, thereby providing for incident light emitted by the vertical cavity surface emitting laser to pass therethrough the cap and the power monitoring system and a portion of the incident light to be absorbed by the power monitoring system.

2. A semiconductor laser package according to claim 1 wherein the plastic resin housing is molded as a one-piece unit.

3. A semiconductor laser package according to claim 1 wherein the power monitoring system is a photodetector.

4. A semiconductor laser package according to claim 1 wherein the power monitoring system includes a plurality of layers of an amorphous silicon material.

5. A semiconductor laser package according to claim 1 wherein the power monitoring system includes a plurality of layers of germanium material.

6. A semiconductor laser package according to claim 1 wherein the plastic resin housing, the vertical cavity surface emitting laser and the power monitoring system have similar coefficients of thermal expansion.

7. A semiconductor laser package comprising:
    a vertical cavity surface emitting laser generating an emission along a path; and
    a molded plastic resin housing including a mounting base, a surround can, and a cap including a surface, for encapsulating the vertical cavity surface emitting laser, the cap having integrally formed thereon a photodetector positioned to cover the complete surface of the cap, thereby providing for the vertical cavity surface emitting laser emission incident on the cap to pass therethrough the cap and the photodetector and a portion of the emission incident on the cap to be absorbed by the photodetector.

8. A semiconductor laser package as claimed in claim 7 wherein the mounting base, the surround can and the cap of the molded plastic resin housing are formed as a plurality of attached components.

9. A semiconductor laser package as claimed in claim 7 wherein the molded plastic resin housing is formed as a one-piece molded unit.

10. A semiconductor laser package as claimed in claim 7 wherein the vertical cavity surface emitting laser, the molded plastic resin housing and the photodetector have similar coefficients of thermal expansion.

11. A semiconductor laser package as claimed in claim 10 further including an underfill material positioned about the vertical cavity surface emitting laser and within an area defined by the molded plastic resin housing, the underfill material, the vertical cavity surface emitting laser and the photodetector having similar coefficients of thermal expansion.

12. A semiconductor laser package according to claim 10 wherein the photodetector includes a plurality of layers of an amorphous silicon material.

13. A semiconductor laser package according to claim 10 wherein the photodetector includes a plurality of layers of a germanium material.

14. A semiconductor laser package comprising:
    a vertical cavity surface emitting laser generating an emission along a path; and
    a molded plastic resin housing including a mounting base, a surround can and a cap, the cap defining integral thereon and positioned to cover a complete surface of the cap a photodetector, thereby providing for the vertical cavity surface emitting laser emission incident on the cap to pass therethrough the cap and the photodetector and a portion of the emission incident on the cap to be absorbed by the photodetector, the photodetector including a plurality of layers of an amorphous silicon material, the molded plastic resin housing encapsulating the vertical cavity surface emitting laser.

15. A semiconductor laser package as claimed in claim 14 wherein the molded plastic resin housing is molded as a one-piece unit, the cap fabricated to permit the emission to pass therethrough.

16. A semiconductor laser package as claimed in claim 14 wherein the molded plastic resin housing is fabricated as a multi-piece unit.

17. A method of forming a semiconductor laser package comprised of the steps of:

provide a vertical cavity surface emitting laser generating an emission along a path;

providing a plastic resin housing, including a mounting base, a surround can and a cap, the cap having integrally formed thereon and positioned to cover a complete surface of the cap, a power monitoring system, thereby providing for the vertical cavity surface emitting laser emission incident on the cap to pass therethrough the cap and the photodetector and a portion of the emission incident on the cap to be absorbed by the photodetector; and mounting the vertical cavity surface emitting laser to an uppermost surface of the mounting base, the surround can positioned on the mounting base to allow for the passage therethrough of the emission, the cap positioned in the path of emission to permit the integrally formed power monitoring system to monitor the emission incident thereon.

18. A method of forming a semiconductor laser package as claimed in claim 17 wherein the integrally formed power monitoring system includes a plurality of layers of an amorphous silicon material.

19. A method of forming a semiconductor laser package as claimed in claim 17 wherein the integrally formed power monitoring system includes a plurality of layers of a germanium material.

\* \* \* \* \*